(12) United States Patent
Tomita

(10) Patent No.: US 6,288,851 B1
(45) Date of Patent: Sep. 11, 2001

(54) OPTICAL SEMICONDUCTOR DEVICE WITH CONVERGENT LENS

(75) Inventor: Yoshihiro Tomita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/425,211

(22) Filed: Oct. 22, 1999

(30) Foreign Application Priority Data

Jun. 2, 1999 (JP) .................................................. 11-154810

(51) Int. Cl.⁷ .............................. G02B 3/00; H01L 23/06
(52) U.S. Cl. ............................................ 359/809; 257/684
(58) Field of Search ................................... 359/809, 810, 359/703; 372/101; 257/432, 433, 434, 435, 436, 684, 688

(56) References Cited

U.S. PATENT DOCUMENTS 5,523,608 * 6/1996 Kitaoka et al. ...................... 257/433

FOREIGN PATENT DOCUMENTS

| 8-327448 | 12/1996 | (JP) . |
| 9-113352 | 5/1997 | (JP) . |
| 10-242519 | 9/1998 | (JP) . |

* cited by examiner

Primary Examiner—Ricky Mack
Assistant Examiner—Gary O'Neill
(74) Attorney, Agent, or Firm—McDermott, Will & Emery

(57) ABSTRACT

An optical semiconductor device with a convergent lens comprising: a convergent lens 1, a wiring pattern 11 formed on a surface of the convergent lens 1, wherein the wiring pattern has an opening for converging a light, and a semiconductor element 2 electrically directly connected with a back surface of the wiring pattern 11 for electrically connecting this to an outside, whereby the size of the device can be miniaturized by preventing outer terminals from protruding from a side surface of a hollow package, and a cost of the device is low.

9 Claims, 3 Drawing Sheets

F I G. 2
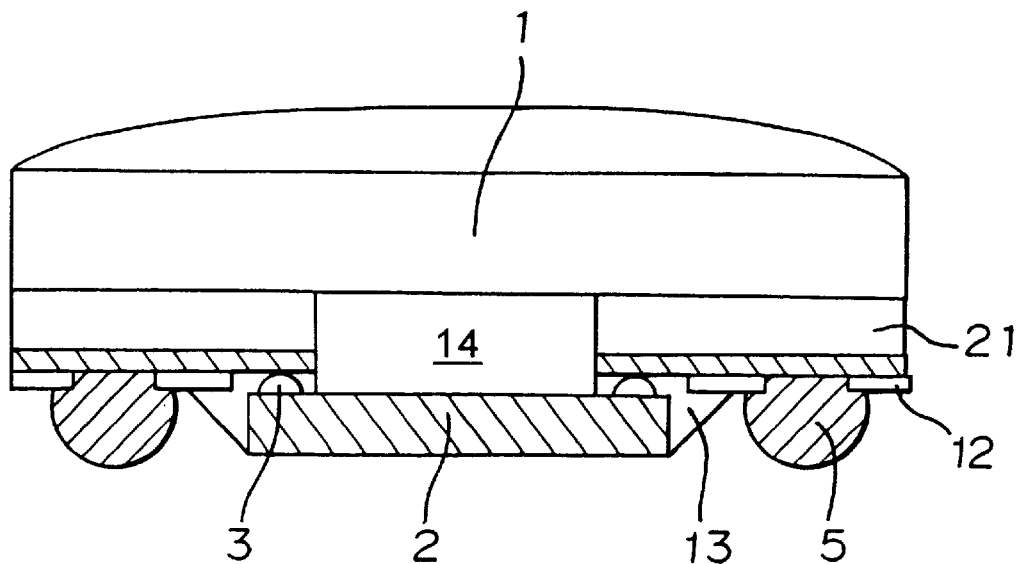
F I G. 3
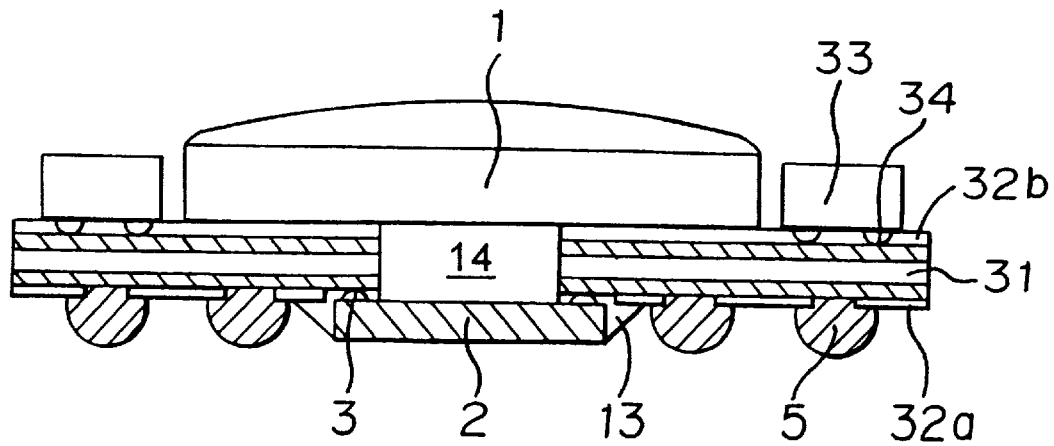

OPTICAL SEMICONDUCTOR DEVICE WITH CONVERGENT LENS

BACKGROUND OF THE INVENTION

1. Field of the Invention

The present invention relates to an optical semiconductor device having a convergent lens.

2. Discussion of Background

FIG. 4 is a cross-sectional view of a conventional semiconductor device. In FIG. 4, numerical reference 1 designates a convergent lens; numerical reference 2 designates a semiconductor element; numerical reference 3 designates an electrode of the semiconductor element; numerical reference 4 designates a wire for connecting the electrode 3 of the semiconductor element to an outer terminal 5; and numerical reference 6 designates a hollow package accommodating the above-mentioned constitutional elements.

Because the conventional semiconductor device having the convergent lens is formed as illustrated in FIG. 4, miniaturization thereof is difficult because of the following features:

(1) the outer terminal 5 is provided on a side surface of the hollow package 6;

(2) the hollow package 6 is used; and (3) the wire 4 is used to connect the electrode 3 of the semiconductor element 2 with the outer terminal 5.

SUMMARY OF THE INVENTION

The present invention is provided to solve the above-mentioned problems inherent in the conventional technique and to provide a miniaturized low-cost optical semiconductor device having a convergent lens.

According to a first aspect of the present invention, there is provided an optical semiconductor device comprising: a convergent lens, a wiring pattern formed on a lower surface of the convergent lens, wherein the wiring pattern has an opening for converging a light, and a semiconductor element, which is directly and electrically connected with a lower surface of the wiring pattern so that the semiconductor element is electrically connected to an outside.

According to a second aspect of the present invention, there is provided an optical semiconductor device comprising: a convergent lens, a wiring board attached to a lower surface of the convergent lens, and a semiconductor element, which is directly and electrically connected to a back surface of the wiring board so that the semiconductor element is electrically connected to an outside.

According to a third aspect of the present invention, there is provided the optical semiconductor device, wherein the wiring board is fabricated by multi layers; and another semiconductor element is equipped on the multi-layer wiring board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a cross-sectional view schematically illustrating an optical semiconductor device having a convergent lens according to Embodiment 2 of the present invention;

FIG. 3 is a cross-sectional view schematically illustrating an optical semiconductor device having a convergent lens according to Embodiment 3 of the present invention.

DETAILED DESCRIPTION OF THE PREFERRED EMBODIMENTS

Figure 1:
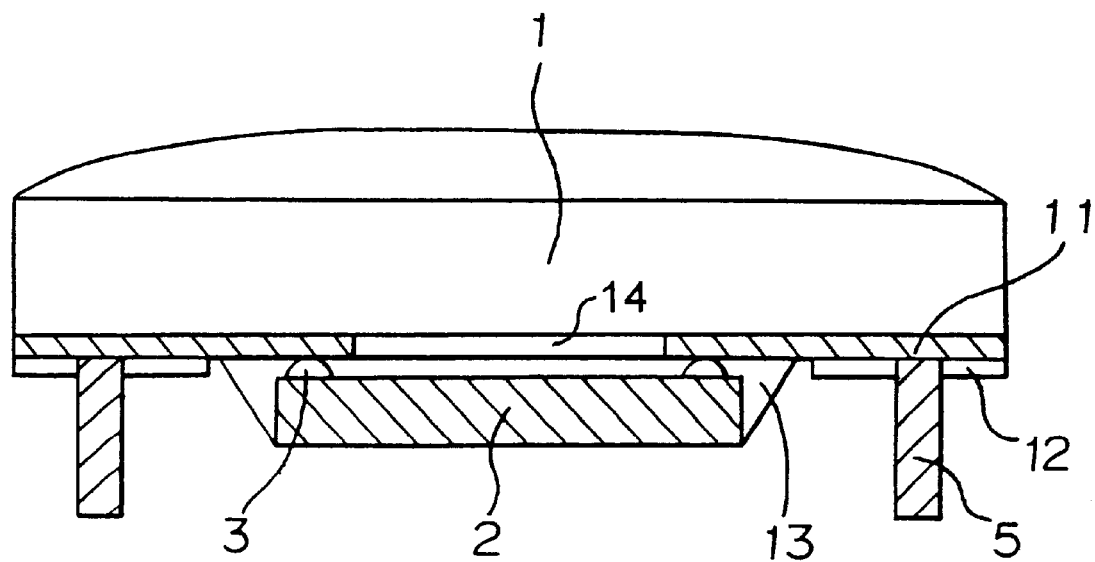
FIG. 1 is a cross-sectional view schematically illustrating an optical semiconductor device having a convergent lens according to Embodiment 1 of the present invention.
Figure 4:
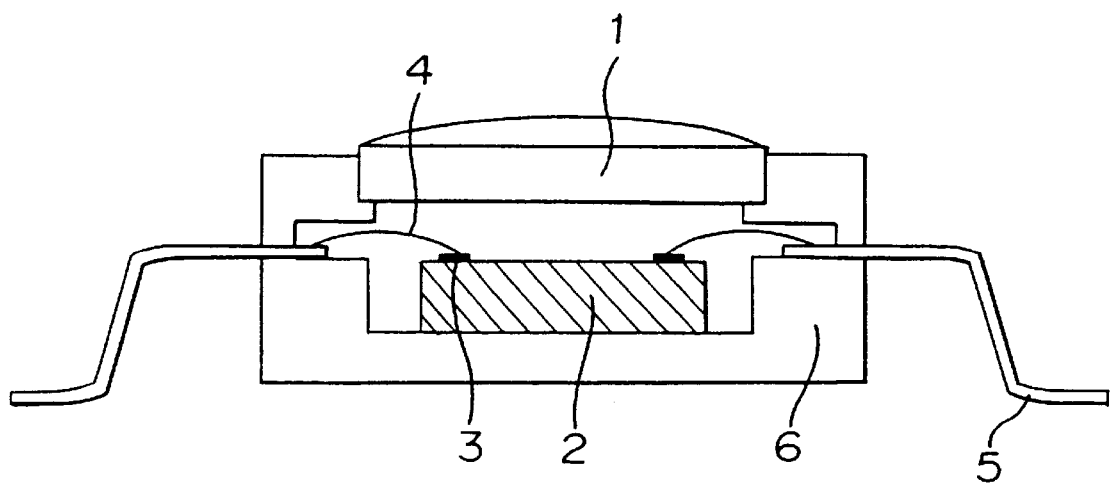
FIG. 4 is a cross-sectional view schematically illustrating a conventional semiconductor device having a convergent lens.

A detailed explanation will be given of preferred embodiments of the present invention in reference to FIGS. 1 through 3 as follows, wherein the same numerical references are used for the same or similar portions and description of these portions is omitted.

Embodiment 1

Embodiment 1 of the present invention will be described in reference of FIG. 1. FIG. 1 is a cross-sectional view illustrating the optical semiconductor device having the convergent lens according to Embodiment 1. In FIG. 1, numerical reference 1 designates the convergent lens; numerical reference 11 designates a wiring pattern, which is formed on a back surface of the convergent lens; numerical reference 2 designates a semiconductor element; numerical reference 3 designates an electrode on the semiconductor element 2, which electrode is electrically connected to the wiring pattern 11; numerical reference 12 designates a resist for protecting the wiring pattern 11; numerical reference 13 designates a sealing material for sealing a connecting portion between the electrode 3 of the semiconductor element 2 and the wiring pattern 11; and numerical reference 5 designates an outer terminal connected to the wiring pattern 11.

For example, JP-A-8-327448 discloses a structure that a substrate for an element is jointed to a silicon substrate, on which a lens is mounted. However, structures of the conventional technique and of the present invention are different at points that the wiring pattern 11 is provided on the back surface of the convergent lens 1 and an opening 14 corresponding to a light receiving portion of the semiconductor element 2 is formed on the wiring pattern 11 to directly connect the semiconductor element 2 with the wiring pattern 11 in accordance with Embodiment 1 of the present invention.

As described, the optical semiconductor device having the convergent lens according to Embodiment 1 demonstrates, due to its structure, the following effects are obtainable in comparison with these of the conventional technique disclosed in JP-A-8-327448.

(1) it is possible to make a cost low because the wiring pattern is directly formed without providing a package substrate; and (2) it is possible to obtain the miniaturized optical semiconductor device having an area substantially the same as an effective aperture of the lens.

As described, the problems in the conventional technique can be solved in terms of the above-mentioned points, and the miniaturized optical semiconductor device with the convergent lens is obtained at a low cost.

Further, although a back surface of the optical semiconductor element is not sealed in Embodiment 1, similar effects are obtainable by sealing the back surface.

Embodiment 2

FIG. 2 is a cross-sectional view illustrating the optical semiconductor device with the convergent lens according to Embodiment 2 of the present invention. In FIG. 2, portions the same as or similar to those described in Embodiment 1 are referred to by the same references and description of these portions is omitted. Numerical reference 21 designates a wiring board attached to on a surface of the convergent lens 1.

Differences of Embodiment 2 from Embodiment 1 are as follows:

(1) the wiring board 21 is laminated on the surface of the convergent lens 1; and (2) the outer terminal 5 is in a pin-like or ball-like shape.

According to the difference (1), as described in Embodiment 1, because an opening 14 corresponding to a light receiving portion of a semiconductor element 2 is formed on the wiring board 21, and the semiconductor element 2 is directly connected to the wiring board, similar effects to those in Embodiment 1 are obtainable, whereby the miniaturized optical semiconductor device having the convergent lens is obtained at a low cost.

According to the difference (2), a shape of the outer terminal is not specifically limited, namely it may be in a pin-like shape or a ball-like shape.

In a case that wiring is provided on a surface of the wiring board, the number of layers of the wiring board is not limited. Further, in Embodiment 2, although a back surface of the semiconductor element is not sealed, similar effects thereto are obtainable by sealing the back surface.

Embodiment 3

FIG. 3 is a cross-sectional view illustrating the optical semiconductor device having the convergent lens according to Embodiment 3 of the present invention. In FIG. 3, portions the same as or similar to those described in Embodiment 2 are referred to by the same references, and description of these portions is omitted.

Numerical reference 31 designates a multi-layer wiring board. Numerical reference 32a and 32b designate resists for protecting wiring layers, which are respectively provided in an upper portion and a lower portion of the multi-layer wiring board 31. Numerical reference 33 designates another semiconductor element. Numerical reference 34 designates an electrode of the semiconductor element 33. The semiconductor element 33 is electrically connected with the wiring layer on a side of the convergent lens 1 of the multi-layer wiring board 31 through the electrode 34.

As described, features according to Embodiment 3 are as follows:

(1) the wiring board has multiple wiring layers, and a plurality of the semiconductor elements are equipped on the wiring board; and (2) a plurality of outer electrodes 5 are arranged like a plane area, in other words the plurality of outer electrodes are provided on a region of a surface of the wiring board so as to form an outline in a two-dimensioned shape, and a larger number of terminals are arranged on the region having a smaller area.

In the optical semiconductor device having the convergent lens according to Embodiment 3, because of the above features (1) and (2) in addition to the features described in Embodiments 1 and 2, it is possible to miniaturize the optical semiconductor device, an entire module, and a mounting board, on which board the optical semiconductor device is equipped.

Although, in Embodiment 3, the semiconductor element 33 is equipped on the wiring layer provided on the side of the convergent lens 1 on the multi-layer wiring board 31, the other semiconductor element 33 may be equipped on any wiring layer, wherein similar effects to those described in Embodiment 3 are demonstrated.

The first advantage of the optical semiconductor device according to the present invention is that the device is miniaturized at a low cost because the wiring pattern is formed on the lower surface of the convergent lens.

The second advantage of the optical semiconductor device according to the present invention is that the mounting board and the entire module are miniaturized when the plurality of semiconductor elements are mounted on the optical semiconductor device, and outer electrodes are arranged like a plane area.

Obviously, numerous modifications and variations of the present invention are possible in light of the above teachings. It is therefore to be understood that within the scope of the appended claims, the invention may be practiced otherwise than as specifically described herein.

What is claimed is:

1. An optical semiconductor device comprising:

a convergent lens;

a wiring pattern formed on a surface of said convergent lens, wherein said wiring pattern has an opening for converging a light; and a semiconductor element electrically directly connected with a back surface of said wiring pattern so that said semiconductor element is electrically connected to an external device.

2. An optical semiconductor device comprising:

a convergent lens;

a wiring board attached to a surface of said convergent lens, wherein said wiring board has an opening for converging light; and a semiconductor element electrically directly connected with a back surface of said wiring board so that said semiconductor element is electrically connected to an external device.

3. The optical semiconductor device according to claim 2, wherein said wiring board is attached to said surface of said convergent lens by bonding.

4. The optical semiconductor device according to claim 2, further comprising:

an outer terminal for electrically connecting said semiconductor element to the external device.

5. The optical semiconductor device according to claim 4, wherein said outer terminal is in a shape of a pin or a ball.

6. The optical semiconductor device according to claim 2, further comprising:

a second semiconductor element mounted on said wiring board, wherein said wiring board is a multi-layer wiring board.

7. The optical semiconductor device according to claim 6, further comprising:

outer terminals for electrically connecting the semiconductor elements to the external device.

8. The optical semiconductor device according to claim 7, wherein said outer terminals are arranged like a plane area.

9. The optical semiconductor device according to claim 6, further comprising:

at least one additional semiconductor element mounted on said multi-layer wiring board.

\* \* \* \* \*